US012701752B2

(12) United States Patent
Witzel et al.

(10) Patent No.: US 12,701,752 B2
(45) Date of Patent: Aug. 4, 2026

(54) TIN AS NUCLEAR SPIN QUBIT IN SILICON

(71) Applicant: National Technology & Engineering Solutions of Sandia, LLC, Albuquerque, NM (US)

(72) Inventors: Wayne Witzel, Albuquerque, NM (US); Dwight Ryan Luhman, Albuquerque, NM (US); Jesse James Lutz, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 489 days.

(21) Appl. No.: 18/240,701

(22) Filed: Aug. 31, 2023

(65) Prior Publication Data

US 2024/0413226 A1     Dec. 12, 2024

Related U.S. Application Data

(60) Provisional application No. 63/471,374, filed on Jun. 6, 2023.

(51) Int. Cl.
| | |
|---|---|
| *G06N 10/40* | (2022.01) |
| *H10D 30/01* | (2025.01) |
| *H10D 48/00* | (2025.01) |
| *H10D 62/815* | (2025.01) |

(52) U.S. Cl.
CPC ........... *H10D 48/385* (2025.01); *G06N 10/40* (2022.01); *H10D 30/014* (2025.01); *H10D 62/8171* (2025.01)

(58) Field of Classification Search
CPC ........ G06N 10/40; H03H 7/38; H10D 48/383; H10D 48/3835
See application file for complete search history.

(56) References Cited

U.S. PATENT DOCUMENTS

2022/0149216 A1 * 5/2022 Dzurak .................. B82Y 10/00

FOREIGN PATENT DOCUMENTS

DE       102020007977 B4 * 11/2021 ............. G06N 10/40

* cited by examiner

*Primary Examiner* — Evren Seven
(74) *Attorney, Agent, or Firm* — Yee & Associates, P.C.; Gregory M. Doudnikoff; Merle W. Richman

(57) ABSTRACT

Coupling qubits is provided. The method comprises embedding a tin atom in a silicon substrate and forming a number of quantum dot electrodes over the silicon substrate. The quantum dot electrodes draw an electron from an electron source into the silicon substrate and performing an electron-nuclear controlled-phase gate operation by: moving the electron adiabatically toward the tin atom to achieve a specified level of hyperfine interaction (HFI) between the electron and the nucleus of the tin atom to minimize the effect of noise; holding the electron at the distance of the specified HIFI for a specified duration of time to represent an "on" state; and moving the electron adiabatically away from the tin atom to lower the HFI below the specified level and represent an "off" state.

20 Claims, 12 Drawing Sheets

QUANTUM DOT ELECTRODES 706

710 Sn ATOM

712

SiO₂ 704

708

702 Si

700

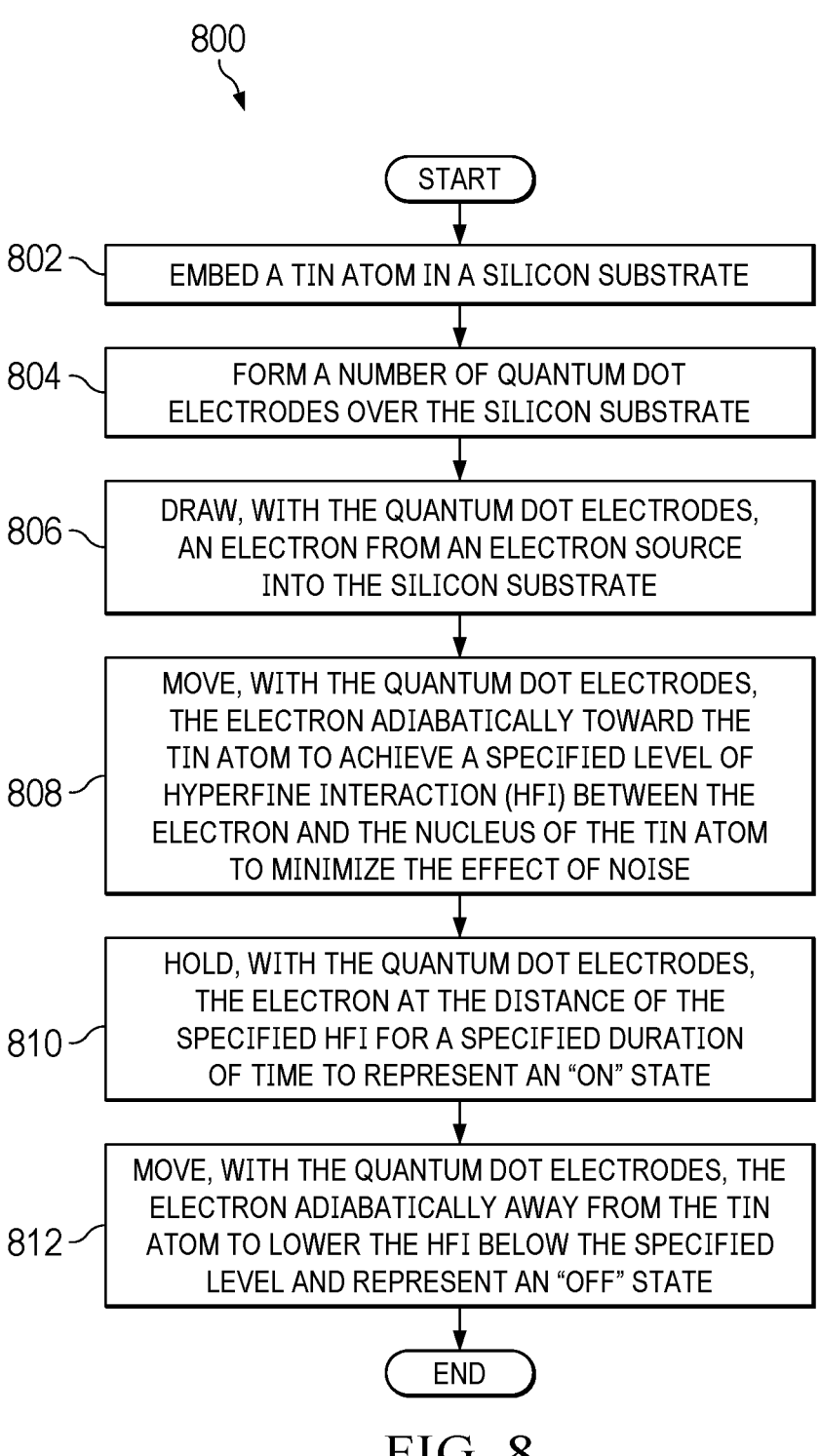

800

START

802 — EMBED A TIN ATOM IN A SILICON SUBSTRATE

804 — FORM A NUMBER OF QUANTUM DOT
ELECTRODES OVER THE SILICON SUBSTRATE

806 — DRAW, WITH THE QUANTUM DOT ELECTRODES,
AN ELECTRON FROM AN ELECTRON SOURCE
INTO THE SILICON SUBSTRATE

808 — MOVE, WITH THE QUANTUM DOT ELECTRODES,
THE ELECTRON ADIABATICALLY TOWARD THE
TIN ATOM TO ACHIEVE A SPECIFIED LEVEL OF
HYPERFINE INTERACTION (HFI) BETWEEN THE
ELECTRON AND THE NUCLEUS OF THE TIN ATOM
TO MINIMIZE THE EFFECT OF NOISE

810 — HOLD, WITH THE QUANTUM DOT ELECTRODES,
THE ELECTRON AT THE DISTANCE OF THE
SPECIFIED HFI FOR A SPECIFIED DURATION
OF TIME TO REPRESENT AN "ON" STATE

812 — MOVE, WITH THE QUANTUM DOT ELECTRODES, THE
ELECTRON ADIABATICALLY AWAY FROM THE TIN
ATOM TO LOWER THE HFI BELOW THE SPECIFIED
LEVEL AND REPRESENT AN "OFF" STATE

END

FIG. 8

TIN AS NUCLEAR SPIN QUBIT IN SILICON

CROSS-REFERENCE TO RELATED APPLICATION

This application claims priority to U.S. Provisional Application 63/471,374, filed Jun. 6, 2023, the entirety of which is hereby incorporated by reference.

STATEMENT OF GOVERNMENT INTEREST

This invention was made with United States Government support under Contract No. DE-NA0003525 between National Technology & Engineering Solutions of Sandia, LLC and the United States Department of Energy. The United States Government has certain rights in this invention.

BACKGROUND

1. Field

The present disclosure relates generally to quantum computer and more specifically to encoding qubits using tin embedded in silicon.

2. Background

As a potential platform for quantum information applications, solid-state nuclear spins have many desirable properties, including exceptionally long relaxation times, fast and precise control, and promising scalability. Impressive progress has been demonstrated toward fabricating and optimizing nuclear-spin systems, among which the most prominent are donors in silicon and color centers within diamond or silicon carbide.

Silicon has been recognized as a host material for quantum computing using donor spin qubits by Kane decades ago, wherein it was argued that a silicon-based platform would eventually outpace competitors by leveraging the myriad fabrication techniques developed in classical microelectronics. Homogeneous platforms, in which the quantum, classical, and interfacial components all coinhabit the same host material, have extraordinary engineering advantages at the classical-quantum interface and proposals have recently emerged describing how to operate a scalable two-dimensional qubit system using a transistor-based control circuit and charge-storage electrodes. Another crucial boon for silicon is its potential to provide a magnetically quiet environment. Naturally occurring silicon possesses a sparsity (<5%) of finite-spin isotopes and, by leveraging modern enrichment techniques, one may achieve very low intrinsic nuclear-spin concentrations. In isotopically enriched silicon, after eliminating dephasing effects through a schedule of pulse sequences, an electron bound to a hydrogen-like phosphorus donor can maintain coherence on the order of several seconds.

Nuclear spins controlled with great precision using nuclear magnetic resonance (NMR), together with the long coherence times characteristic of well-separated nuclear spins in enriched silicon, can lead to excellent single-qubit performance. For quantum computation, however, we must generate entanglement between qubits as well. In the original Kane architecture, this is accomplished through a tunable exchange interaction between bound electrons on neighboring donors. The strong donor-confinement potential limits the extent of the bound electron—for example, the prototypical P donor is characterized by an effective Bohr radius of only 1.8 nm—introducing challenging fabrication requirements, which is further complicated by valley-orbit-induced exchange oscillations that arise in silicon.

Therefore, it would be desirable to have a method and apparatus that take into account at least some of the issues discussed above, as well as other possible issues.

SUMMARY

An illustrative embodiment provides a method for coupling qubits. The method comprises embedding a tin atom in a silicon substrate and forming a number of quantum dot electrodes over the silicon substrate. The quantum dot electrodes draw an electron from an electron source into the silicon substrate and performing an electron-nuclear controlled-phase gate operation by: moving the electron adiabatically toward the tin atom to achieve a specified level of hyperfine interaction (HFI) between the electron and the nucleus of the tin atom to minimize the effect of noise; holding the electron at the distance of the specified HFI for a specified duration of time to represent an "on" state; and moving the electron adiabatically away from the tin atom to lower the HFI below the specified level and represent an "off" state.

Another illustrative embodiment provides a qubit coupling system. The system comprises a silicon substrate, a tin atom embedded in the silicon substrate, and number of quantum dot electrodes over the silicon substrate. An electron source is connected to the silicon substrate. The quantum dot electrodes are configured to adiabatically move an electron from the electron source toward the tin atom to achieve a specified level hyperfine interaction (HFI) between the electron and the nucleus of the tin atom to minimize the effect of noise. The quantum dot electrodes are configured to hold the electron at the distance of specified HFI for a specified duration of time, which represents an "on" state. The quantum dot electrodes are also configured to adiabatically move the electron away from the tin atom to lower the HFI below the specified level, which represents an "off" state.

The features and functions can be achieved independently in various examples of the present disclosure or may be combined in yet other examples in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

3

Figure 3A:
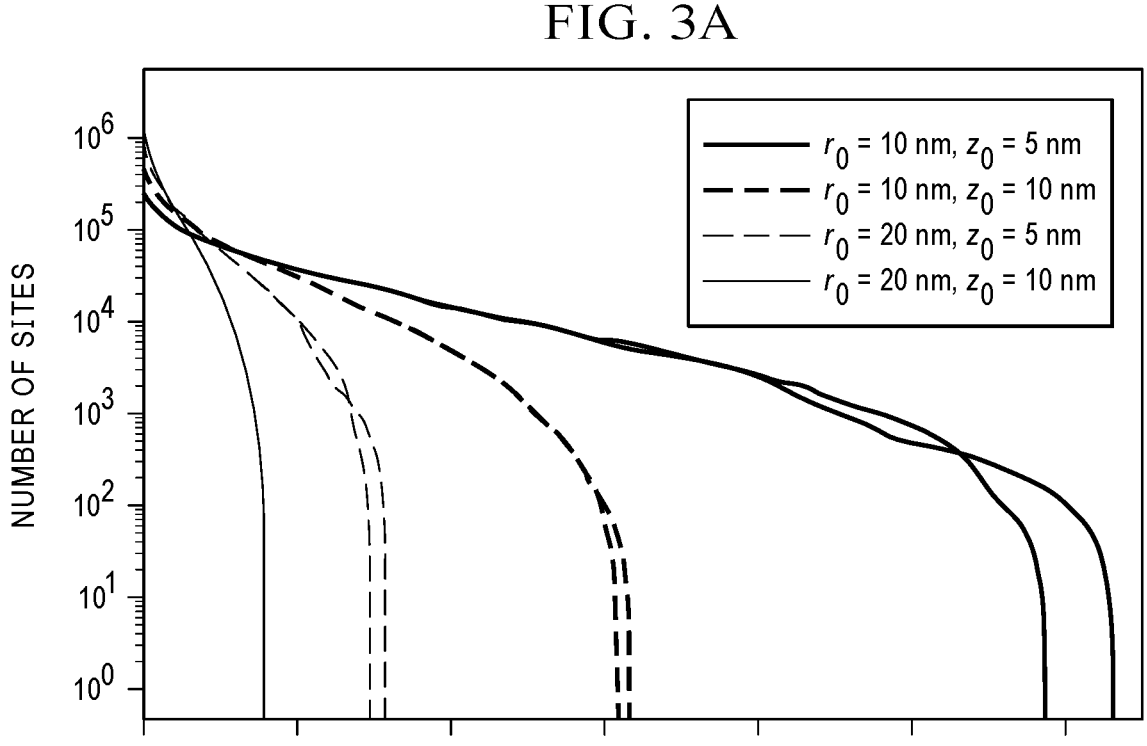
Figure 3B:
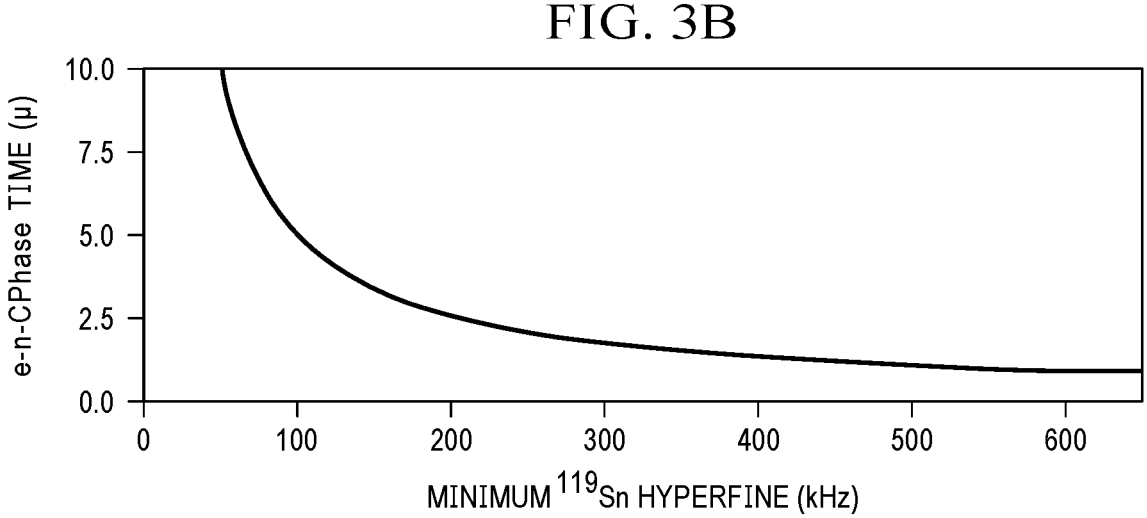

FIG. 3A depicts a graph illustrating the number of lattice site locations at which $^{119}$Sn has a hyperfine interaction (HFI) above the corresponding minimum strength in frequency units for various quantum dot shapes and valley-phase extremes;

FIG. 3B depicts a graph illustrating the minimum e-n-CPhase gate time corresponding to the HFI strengths shown in FIG. 3A.

Figure 4A:
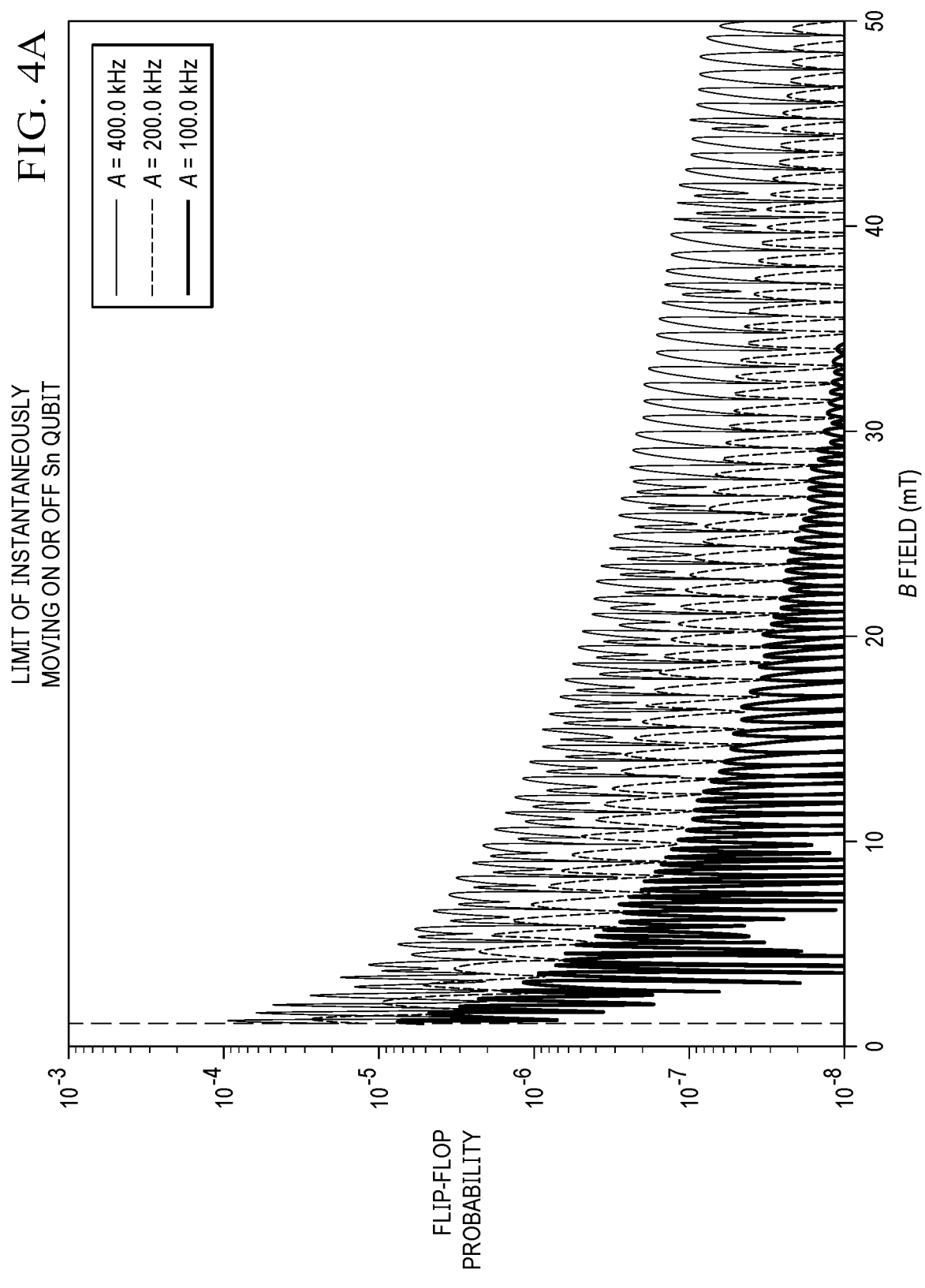
Figure 4B:
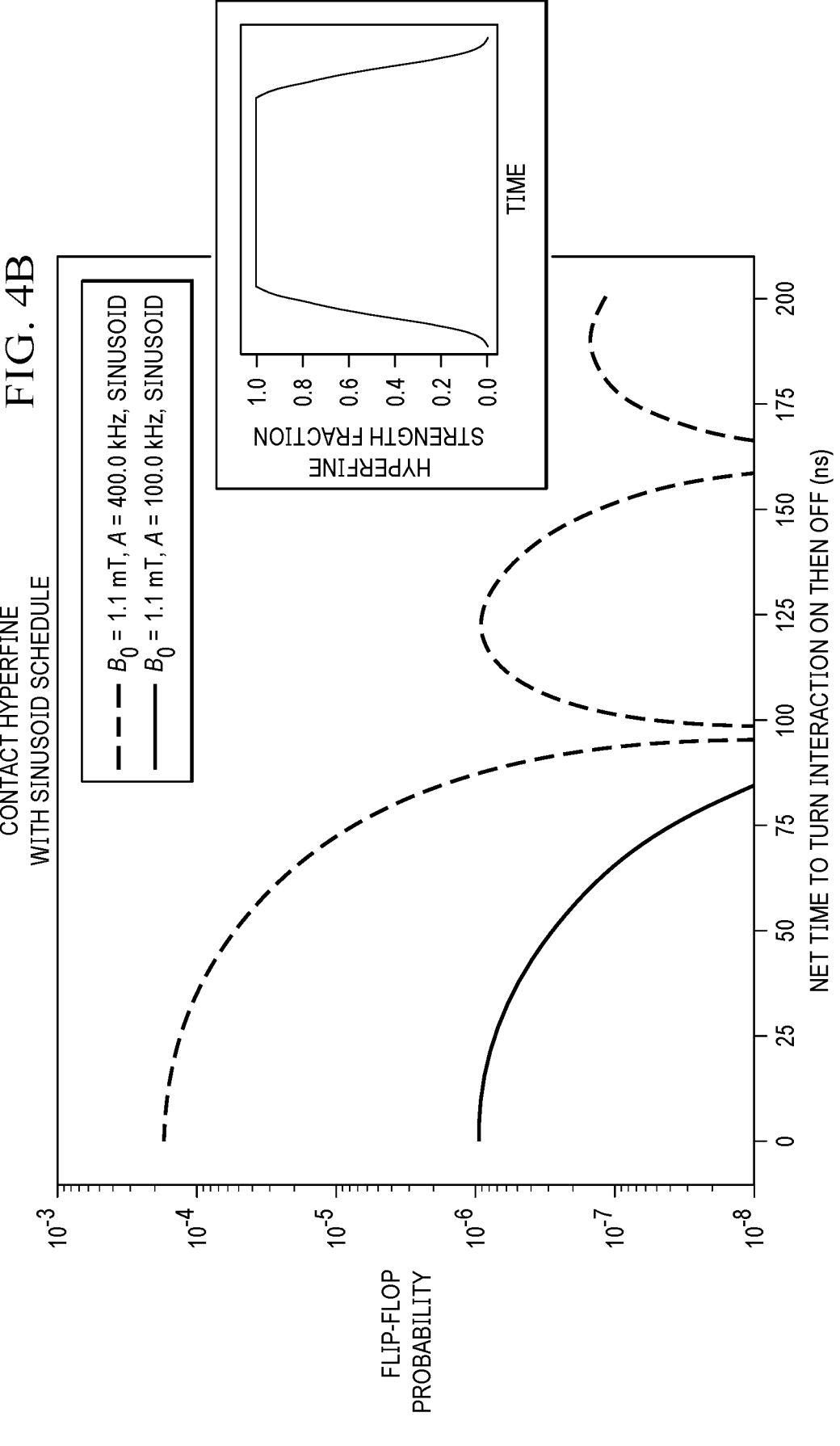
Figure 5:
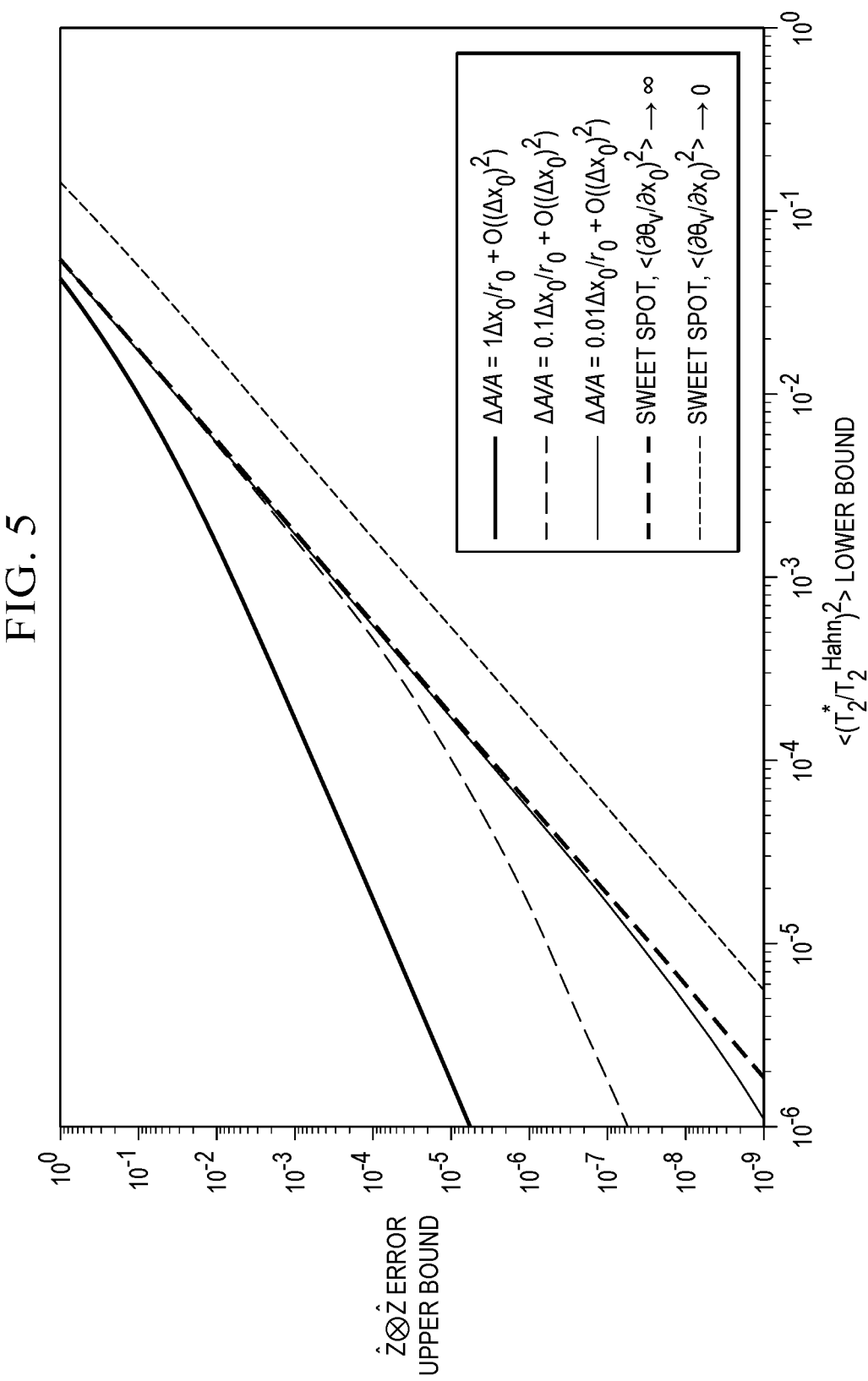
Figure 6:
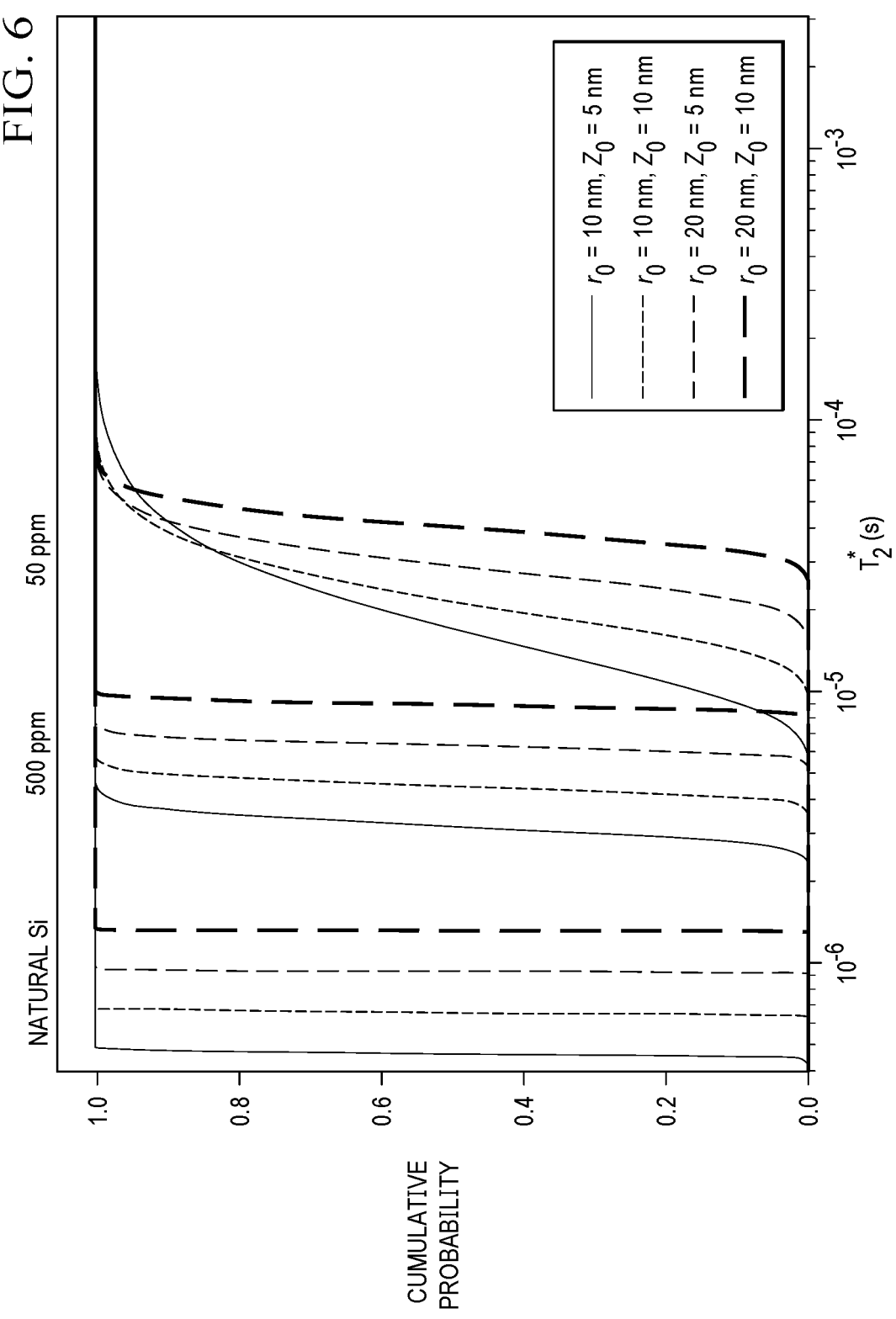
Figure 7A:
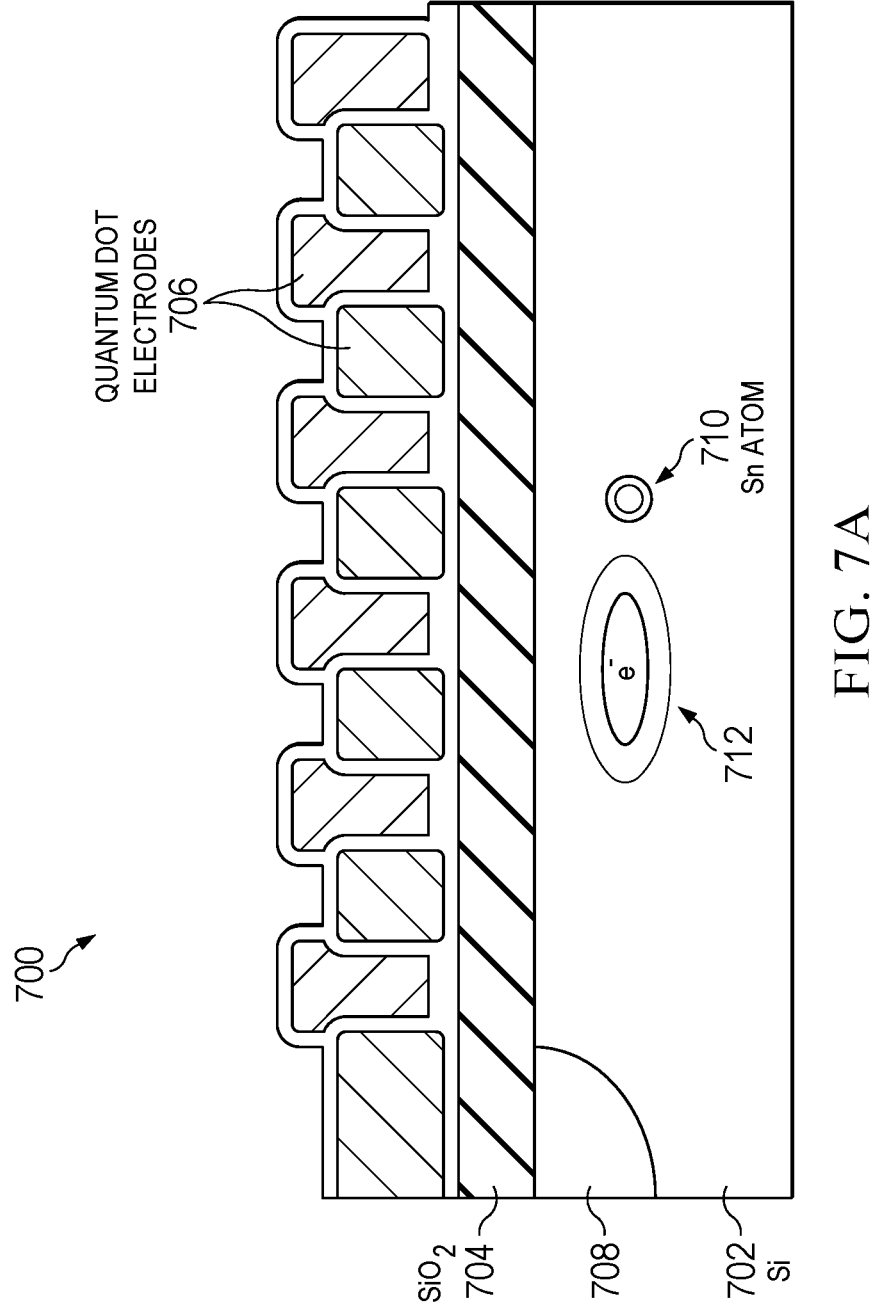
Figure 7B:
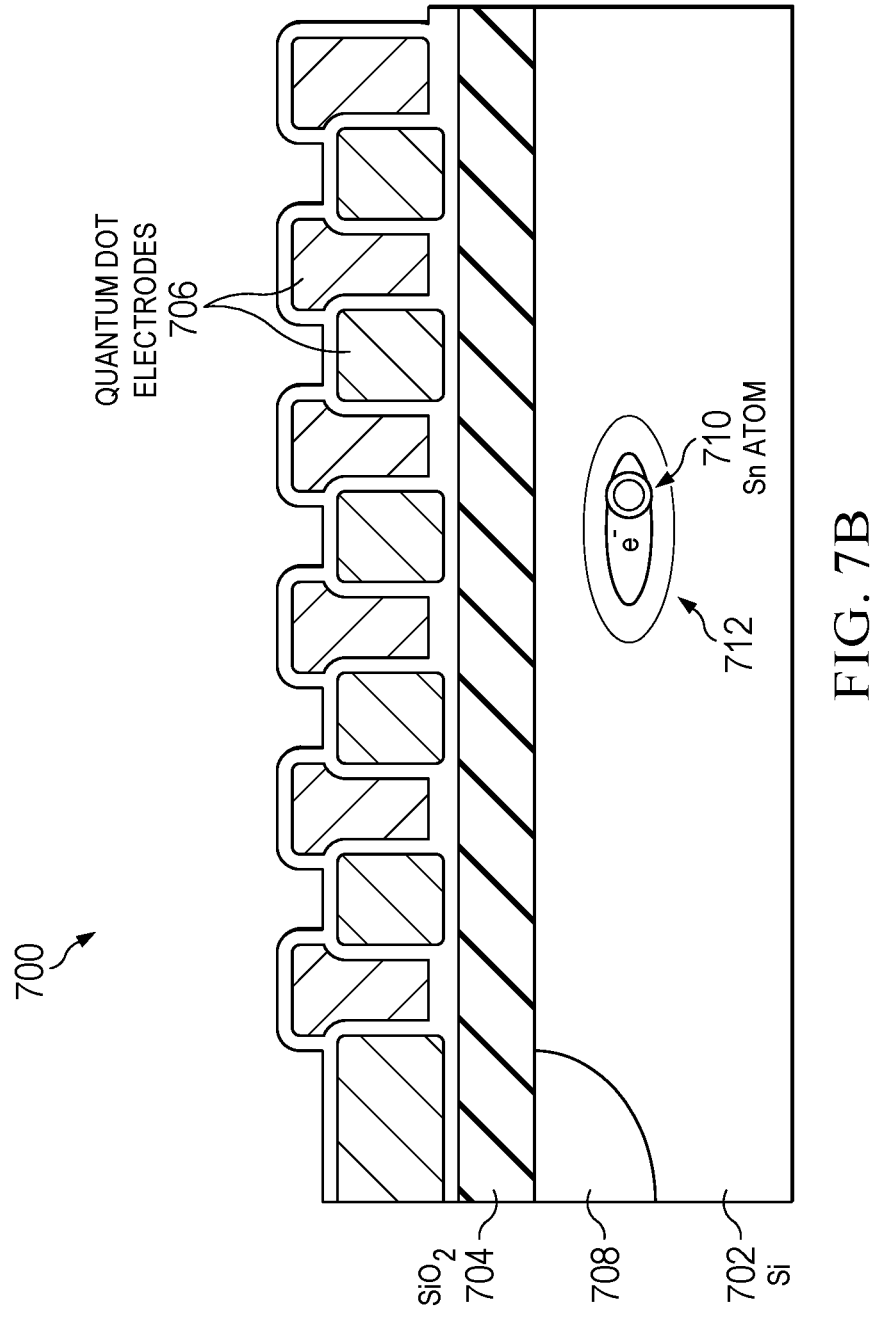

FIG. 4A depicts a graph illustrating diabatic flip-flop probabilities as a function of the external magnetic field for three different HFI strengths taken in the limit of instantaneous HFI on-off switching;

FIG. 4B depicts a graph illustrating the diabatic flip-flop probabilities as a function of the net on-off switching times at B0=1.1 mT using a sinusoidal shape for the hyperfine transitions;

FIG. 5 depicts a graph illustrating the upper bound of $\hat{Z} \otimes \hat{Z}$ error probability versus the lower bound of $\langle (T^*{}_2/T_2)^2 \rangle$ under various conditions;

FIG. 6 depicts a graph illustrating cumulative probability distributions of $T^*{}_2$ for various quantum dot shapes and enriched levels of $^{29}$Si;

FIG. 7A depicts the qubit coupling system in an off position in accordance with an illustrative embodiment;

FIG. 7B depicts the qubit coupling system in an on position in accordance with an illustrative embodiment; and FIG. 8 depicts a flowchart illustrating a process for coupling qubits in accordance with an illustrative embodiment.

DETAILED DESCRIPTION

The illustrative embodiments recognize and take into account that a promising alternative technique for two-qubit entanglement between arbitrary nuclear-spin-qubit pairs involves electron shuttling. In this concept, an ancilla electron is initially entangled with one nuclear spin simply through the hyperfine interaction (HFI), in what we call an electron-nuclear controlled-phase (e-n-CPhase) gate operation, and is then coherently transported via an array of quantum dots to interact with a second nuclear spin to achieve long-range nuclear-nuclear entanglement. An initial demonstration of coherent spin-qubit transport in silicon, critical to this approach, has been demonstrated, with a promising coherence transfer fidelity of 99.4%.

The illustrative embodiments also recognize and take into account that donor nuclear spins in silicon represent some of the most coherent qubits available and exhibit a substantial HFI due to the electrostatic confinement. However, the shuttling approach to two-qubit nuclear-spin entanglement introduces an additional constraint: the electron must be moved on and off the nuclear spin adiabatically to prevent coherence loss, which may be challenging for a strongly bound electron on a donor.

In contrast, isoelectronic group-IV nuclides pose no obstacle regarding electron shuttling, since they do not provide intrinsic electrostatic confinement. Instead, the confinement of the electron is controlled by electrodes that define a quantum dot. If an isoelectronic atom resides within the quantum dot, there will be an HFI between an occupying electron and the atom, although weaker than the donor case. In the case of a $^{29}$Si atom (nuclear spin-½), HFI can be prominent enough to initialize, read out, and control single nuclear spins, paving the way for consideration of other isoelectronic species.

The illustrative embodiments also recognize and take into account that while there are a number of naturally abundant group-IV nuclides with nonzero spin, we find Sn isotopes especially interesting because they are expected to have a strong HFI compared to $^{29}$Si, they are spin-½, and they are soluble in silicon. Other group-IV nuclides fall short in at least one of these areas. To be specific, $^{13}$C is predicted to have a relatively small HFI, $^{73}$Ge has I=9/2 nuclear spin, and 207Pb has negligible solubility in silicon. We note that the I=9/2 spin of $^{73}$Ge opens intriguing avenues in quantum information science and there has been encouraging progress in the nuclear-spin control of I>½ donors. However, the simplicity is attractive for spin-½ systems as they have no possibility of leakage, no quadrupole interaction contributing to relaxation, and they lend themselves well to electron shuttling and the e-n-CPhase operation of the illustrative embodiments.

The illustrative embodiments provide a method of using Sn incorporated into silicon as a nuclear-spin qubit, where qubit interactions are achieved through electron shuttling. We focus our analysis on two main objectives, with emphasis on the $^{119}$Sn isotope, since it has the largest gyromagnetic ratio and the greatest natural abundance of the nonzero spin isotopes, although $^{117}$Sn is comparable.

Spin-flip errors are greatly suppressed (<10–6) with a modest B (magnetic) field (>15 mT) and we use a unique analysis to infer an upper bound on the HFI variability due to charge or voltage noise based upon a comparison between $T_2$ and $T^*{}_2$, which suggests that a phase-flip error on the nuclear-spin qubit during the operation could be below $10^{-7}$ with sufficient control over the quantum dot location owing to a first-order insensitivity to the noise. A phase-flip error on the electron spin is much more significant without extremely high enrichment but this error can be mitigated using dynamical decoupling or through monitoring and compensation.

The e-n-CPhase gate is a straightforward entangling operation with the potential to be extremely robust (insensitive to noise). The prospect of high-fidelity two-qubit gates together with the prospect of shuttling and the simplicity and proven performance of NMR-driven single-qubit operations is remarkably promising for quantum information processing.

As mediator of the primary mode of initializing, addressing, and measuring individual nuclear spins in our scheme, the HFI is a key factor dictating the feasibility of both single- and intersite nuclear-spin operations. Importantly, intrinsic $^{29}$Si has a sufficiently strong HFI to facilitate a shuttle-based electron nuclear-spin approach. Extrinsic defects in silicon, on the other hand, have the potential for a stronger HFI, which will, in turn, reduce gate times and suppress external noise (e.g., from extraneous nuclear spins). Below, we provide an estimate of the HFI for Si:Sn, filling an apparent gap in the literature. To this end, atomic scale density-functional theory (DFT) calculations are performed to facilitate comparisons between an intrinsic $^{29}$Si nucleus and spin-active Sn nuclides residing in a Si host.

An HFI occurs when an unpaired electronic spin encounters any nucleus possessing a nonvanishing magnetic moment. In such cases, the electronic Hamiltonian is separable as $\mathcal{H} = \mathcal{H}_0 + \mathcal{H}_{hf}$, with $\mathcal{H}_0$ describing the field-free electronic Bloch states and with the hyperfine Hamiltonian given by $$\mathcal{H}_{hf} = I \cdot A \cdot S, \tag{1}$$

US 12,701,752 B2

5 where I and S are the nuclear and electronic spin operators and where A is a tensor of coupling terms. Truncating at first order in a nonrelativistic perturbation expansion, Eq. (1) becomes (in SI units)

$$\mathcal{H}_{hf}^{(I)} = \frac{2\mu_0}{3}\gamma_e\mu_e\gamma_I\mu_I[I \cdot S\delta(R_I)] + \tag{2}$$

$$\frac{1}{4\pi r^3}\mu_0\gamma_e\mu_e\gamma_I\mu_I\left[\frac{3(I\cdot\hat{r})(I\cdot\hat{r})}{r^2} - I\cdot S\right],$$

where $\mu_0$ is the permeability of vacuum, $\gamma_e$ is the electron g factor, $\mu_e$ is the Bohr magneton, $\gamma_I$ is the gyromagnetic ratio, $\mu_I$ is the nuclear magneton, $R_I$ is the position of the nuclear center, r is the electron-nucleus distance, and I·S δ(RI) is the strength of the electron-nuclear spin-spin coupling for nucleus I.

Under conditions of interest, where the electron is moved through electrostatic controls to maximize the HFI, the anisotropic terms are weak and A is dominated by the isotropic Fermi-contact interaction (FCI), which can be obtained by integrating the first term of Eq. (2) over the electronic wave function to obtain (in atomic units)

$$A \approx A_{FCI} = -\frac{8\pi}{3}\gamma_e\mu_e\gamma_I\mu_I|\Psi(R_I)|^2, \tag{3}$$

where $|\psi(R_I)|^2$ is the electron density at the nucleus.

The bunching factor, a quantity closely related to the FCI, has been defined by as $\eta=|\psi(R_I)|^2/\langle\psi^2\rangle_{Av}$, with the denominator being the average density taken over the unit cell. It quantifies the electrondensity enhancement or "bunching" at a given nuclear center. η has also been formulated using spin densities ($\rho_{spin}=\rho_{52}-\rho_\downarrow$), and there is a DFT-based procedure for computing η for the intrinsic $^{29}$Si nucleus in a silicon quantum dot. This approach generates DFT spin densities on a pristine silicon system augmented with an additional conduction-band electron constrained to the conduction-band edge. The bunching factor is then calculated as $$\eta = \frac{\rho_{spin}(R_I)}{[\rho_{spin}]_{Av}}, \tag{4}$$

where $[\ldots]_{Av}$ is the average spin density in the cell. The illustrative embodiments extend this procedure to extrinsic defects in silicon.

The calculations reported here are performed using full-potential Kohn-Sham DFT within a basis of linearized augmented plane waves (LAPWs) plus local orbitals, as implemented in the WIEN2k V19.1 electronic structure software package. The Perdew-Burke-Ernzerhof exchange-correlation (PBE) generalized-gradient approximation is employed to compute the exchange-correlation potential within an all-electron formalism of spin-polarized valence and core states. Scalar relativistic effects are also included, with spin-orbit coupling introduced via a separate variational optimization step including $p_{1/2}$ basis functions. Core states are treated fully relativistically.

The bunching factors reported in the present study are obtained in a three-step process. Prepending to the two-step procedure pioneered by Assali et al. [44], a structural optimization is performed first, in which the charge density and nuclear positions are simultaneously optimized in each self-consistent-field (SCF) cycle [51,52], while excluding spin polarization and spin-orbit coupling. This underlying structure is then used to converge spin-polarized spin-orbit SCF cycles for the neutral system. Next, an additional electron is added to the system, accompanied by a uniform positive jellium background, which serves to eliminate interimage long-range multipole interactions, and, finally, the Kohn-Sham potential is obtained. As described by Assali et al., this procedure effectively constrains the extra electron to a fixed k point corresponding to the conduction-band edge of the neutral system. The desired quantity, ρspin, is computed by summing over individual occupied atomic-like alpha and beta spin orbital densities as $$\sum_i |\psi_i^\alpha(r)|^2 \text{ and } \sum_i |\psi_i^\beta(r)|^2.$$

To avoid the nuclear singularity, the contact interaction is estimated by averaging about a diameter given by the Thomson radius, $$r_T = Ze^2/mc^2,$$

defined as the distance at which the Coulomb energy due to the nuclear charge, given by the atomic number Z times the elementary charge e, is equal to the electron rest energy in terms of its mass m and the speed of light c.

First-principles computational modeling is an essential tool for the prediction and interpretation of spin-related defect properties observed in silicon and other candidate point-defect qubit materials. For the intrinsic spin-½ $^{29}$Si nucleus, simulation has played an important role in validating experiments. In 1956, ηSi=186±18 was obtained from NMR data, while in 1964, the same data were reinterpreted, resulting in a revised value of $\eta_{Si}$=178±31. Meanwhile, values of ηSi≳300 and $\eta_{Si}$=100±10 have been obtained from a 1992 Overhauser-shift and a 1964 Knight-shift measurement, respectively. All-electron DFT calculations have predicted the value as $\eta_{Si}$=159.4±4.5. Meanwhile, implementing a k·p correction on top of DFT calculations has obtained $\eta_{Si}$=88, which agrees better with the 1964 Knight-shift measurement.

Due to the controversy surrounding the accepted value for ηSi, we seize upon the opportunity to further validate against an unambiguous reference value of ηGe=570±171 obtained by leveraging noise spectra measured for the Si:$^{73}$Ge system. The 30% uncertainty associated with this value, which seems large at first, is quite comparable to the spread of experimental ηSi values. Therefore, in preparation for computing the target value for Sn, $\eta_{Sn}$, we first compute ηSi and ηGe. The reason for this is twofold. In addition to validating the applicability of our procedure for Si:Sn, demonstrating agreement for a second benchmark system bolsters confidence that our ηSi is of similar accuracy, thereby adding another data point toward the adoption of an accepted value for $\eta_{Si}$.

Figure 1A:
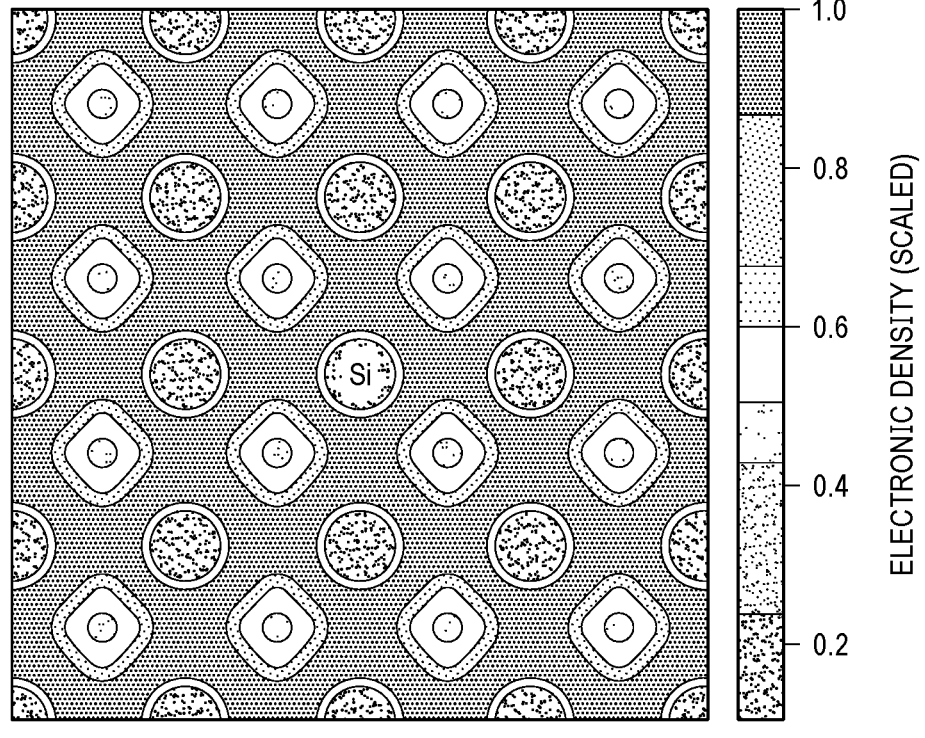
FIG. 1A illustrates Burke-Ernzerhof exchange-correlation density-functional theory (PBE-DFT) electron-spin densities for immaculate Si.
Figure 1B:
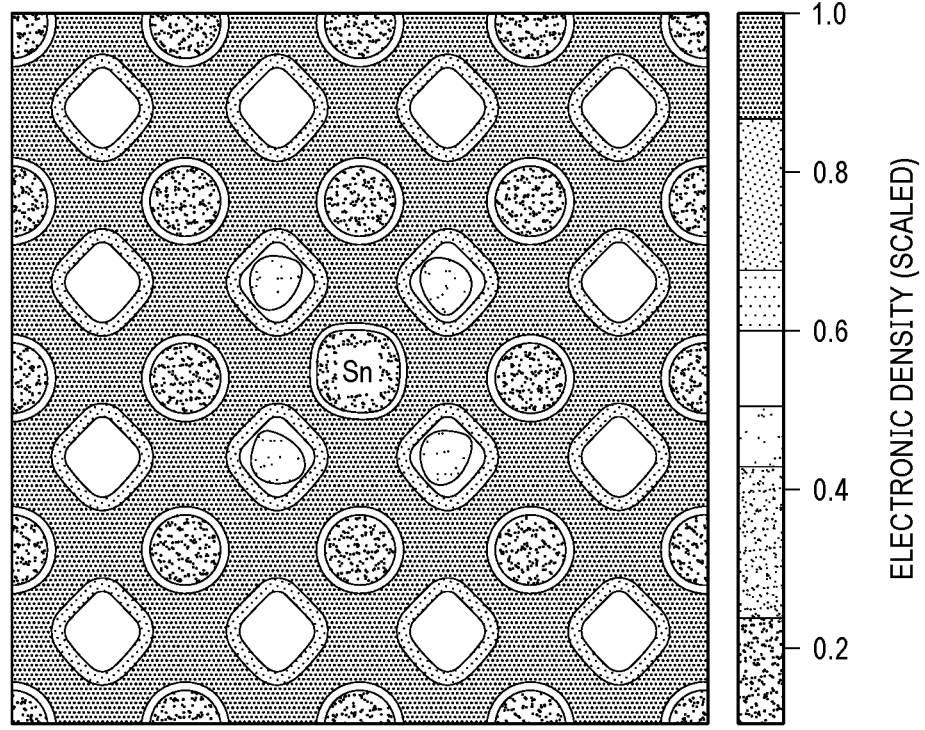
FIG. 1B illustrates PBE-DFT electron-spin densities for Sn embedded in Si.
Figure 1C:
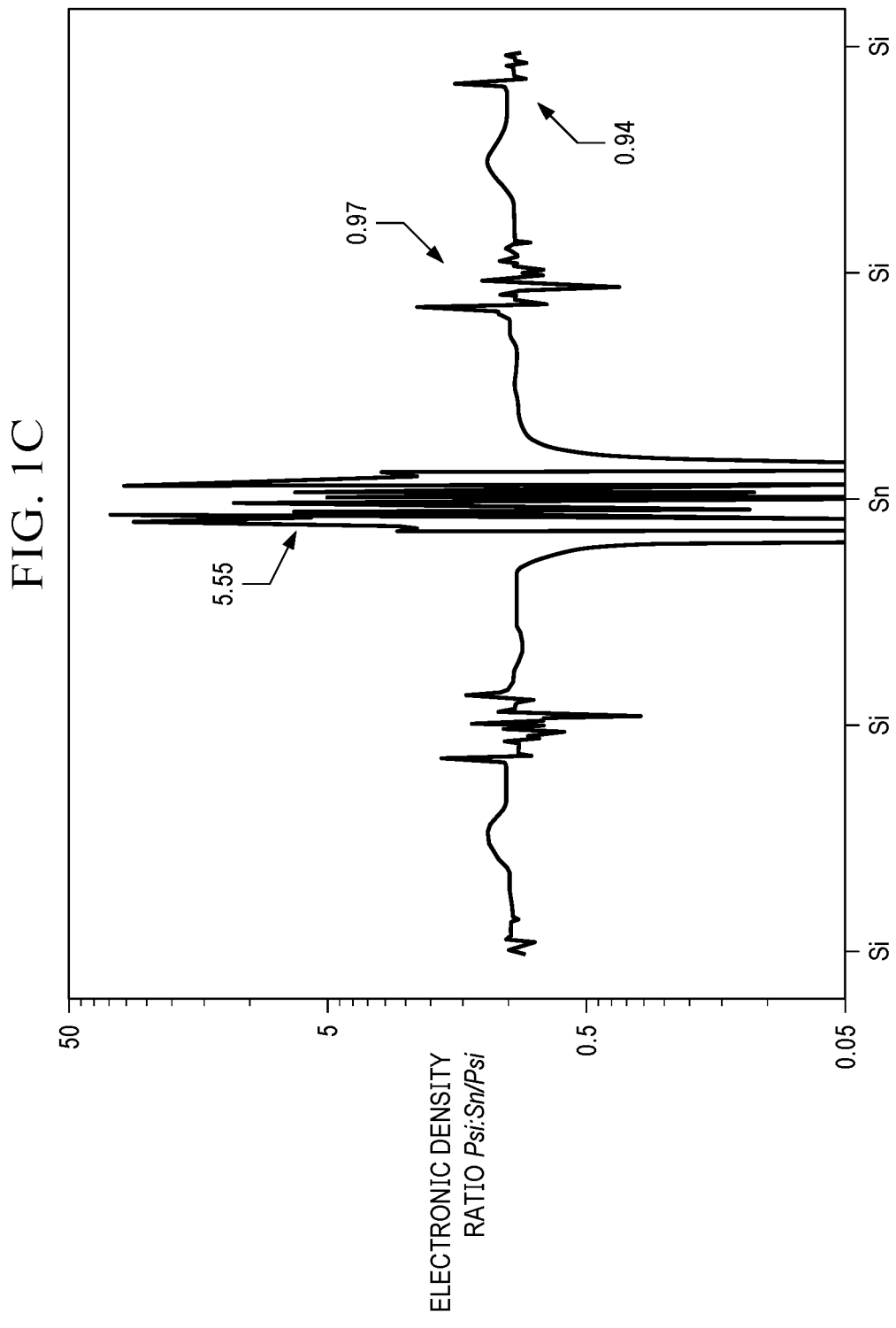
FIG. 1C illustrates the ratio of diagonal cross section of the electron-spin densities shown in FIGS. 1A and 1B.

As a first check of our computational procedure, we seek to confirm that a conduction electron will indeed have an increased probability density at the Sn sites, without being too strongly localized and donor like. That is, we do not want wave-packet localization to disrupt the ability to smoothly move a quantum dot electron with electrostatic controls. FIGS. 1A-1C show the scaled electronic density of a 4×4×4 Si supercell for pristine Si (FIG. 1A), a defective Si:Sn system (FIG. 1B), and the ratio of the two along a diagonal line cut (FIG. 1C). Note that the Sn impurity slightly modifies the interstitial region adjacent to Sn (light gray) but it does not significantly deform the density of the adjacent Si sites (deep gray) relative to the more distant neighbors. This is quantified in the ratio plot, where we indicate the values at the Sn and Si site locations. As compared with a Si nucleus in the pristine bulk, the density at the substitutional Sn nucleus is over 5 times higher. Meanwhile the neighboring Si contact densities are changed by only a few percent. This distinguishes an isoelectronic defect from a donor. It is thus expected that introducing a Si:Sn impurity will only weakly impact the extent of the envelope of the electronic wave function.

Figure 2:
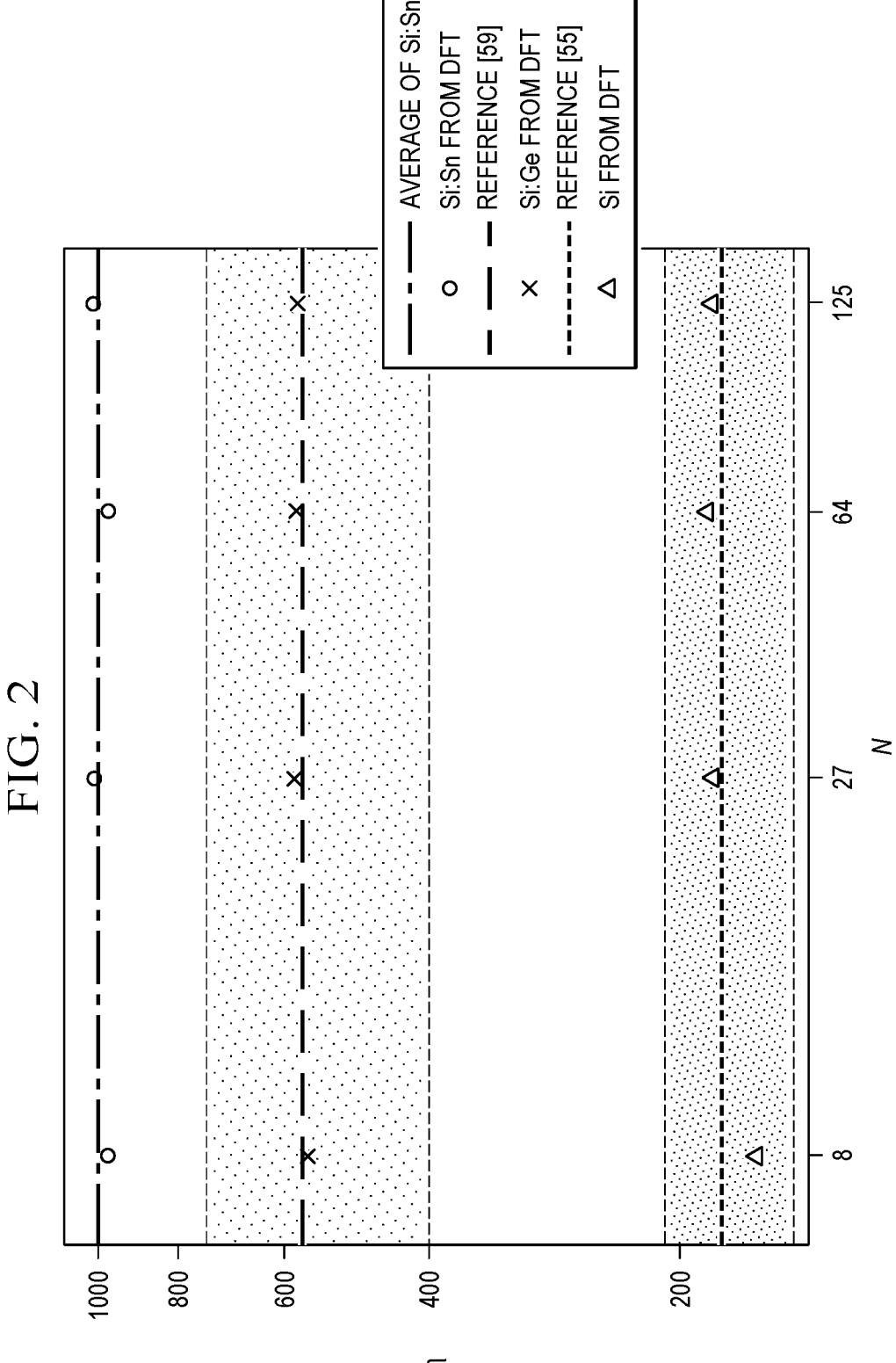
FIG. 2 illustrates a graph of Fermi-contact densities for $^{29}$Si, $^{73}$Ge, and $^{119}$Sn defects in silicon.

Next, we move to compute $\eta$ values as defined in Eq. (4), which unlike the density ratios above, require computation of electron-spin densities for a single system only. We perform convergence studies with respect to both supercell size and the number of k points, with computations performed on $n^3$-atom supercells having n=2, 3, 4, 5 using integration grids containing between eight and 2000 k points. FIG. 2 collects the computed $\eta$ values for $^{29}$Si, $^{73}$Ge, and $^{119}$Sn defects in silicon, showing for comparison the experimental $\eta_{Si}$ value of Wilson and the $\eta_{Ge}$ value of Kerckhoff et al. Good agreement is found between the measured and theoretical values for both $\eta_{Si}$ and $\eta_{Ge}$, which bolsters confidence in the accuracy of our computed value of $\eta_{Sn}$=996.4, obtained as an average over several supercell sizes. Alternatively, this may be expressed as a ratio with respect to $^{29}$Si in immaculate silicon as $\eta_{Sn}$=5.6 $\eta_{Si}$, which is virtually identical to the density ratio at the Sn nucleus shown in FIG. 1C. Subsequent application of the gyromagnetic ratios returns an HFI enhancement factor of over 10 for Si:$^{119}$Sn, as compared with intrinsic Si:$^{29}$Si. Furthermore, by including a standard correction for relativity in Eq. (3), the Si:Sn absolute HFI grows to 2400, corresponding to an enhancement of 13.5 times the value of intrinsic $^{29}$Si. As a conservative estimate for the analysis that follows, we adopt the nonrelativistic enhancement factor of 10.

To compute actual HFI strengths for individual nuclei, the envelope of the quantum dot wave function must be known. As a convenient proxy, we use a simple model that derives from a well with infinite barrier and parabolic lateral confinement at zero electric field. At each nuclear site n, with a bunching factor of $\eta_n$, our proxy wave function, parametrized by a radius $r_0$ and thickness $z_0$, is $$|\psi(n)|^2 \propto \eta_n e^{-i[(x_n - x_0)^2 + (y_n - y_0)^2]/r_0^2} \qquad (5)$$

$$\cos^2\left(\frac{z_n \pi}{z_0}\right) \times \cos^2(k_0 z_n - \theta_v/2),$$

where $\theta_v$ is the valley phase. Since the valley phase of a quantum dot may depend upon local chemical details of the quantum dot environment and its interfaces, we treat it as an independent parameter in our model. The valley oscillation frequency is based upon effective mass theory for silicon, $k_0$=0.85×2 $\pi/a_0$, with $a_0$=0.543 nm as a standard lattice constant for Si. The form of this last valley-dependent factor is dictated by the symmetry of the bulk-silicon lattice (with translation and inversion symmetry). Using this model, our estimate of $\eta_{Sn}$=996.4, and the gyromagnetic ratio of Sn, FIG. 2A shows the distribution of hyperfine interaction strengths at all possible sites for a few different quantum dot shapes. FIG. 2B shows corresponding minimum gate times for an e-n-CPhase operation.

For a complete error model, one must also study electron-spin preparation and measurement and shuttling of individual electrons, as well as electron spin resonance (ESR) and NMR single-qubit rotations, all of which have all been demonstrated experimentally, with promising results. Our theoretical analysis suggests that two-qubit operations between transportable electrons and stationary Sn nuclei can have exceptionally good fidelities, holding great promise as a quantum information processing technology.

Up to local Z rotations, the e-n-CPhase gate is straightforward to implement in the presence of a finite magnetic field. Start with the electron away from the nuclear-spin qubit, such that their interaction is negligible. Next, adiabatically move the electron to maximize the HFI with the target nucleus and hold the electron there for a specific duration of time. Finally, adiabatically move the electron away again. In the adiabatic limit, the operation must be diagonal in the original eigenbases of the two spins (with the quantization axis predominantly determined by the external magnetic field). Assuming that the transit duration is negligible compared with the holding duration, this operation will induce a controlled-Z rotation component in the original eigenbases that is approximately linear in the holding duration. Setting this duration for a rotation of $\pi$ will generate the e-n-CPhase operation apart from an inconsequential global phase and local Z rotations (accounting for the 4 degrees of freedom of the diagonal unitary operation). We may compensate for systematic local Z rotations through single-qubit rotations effected by magnetic resonance pulses.

The contact HFI is short range (being proportional to the electron density at the nucleus) and much stronger than the longer-range dipolar interaction (which is below 8 Hz at a 20-nm distance and scales inversely with distance cubed). Therefore, we can regard the interaction between a Sn nucleus and an electron to effectively be switched off except during the time when the electron is in close proximity to the Sn qubit for an intended operation. For comparison, the dipolar interaction between electrons is about 1800 times stronger (13 kHz at 20 nm, or 13 Hz at 200 nm). However, if a proper distance is maintained between different electron qubits and the electron qubits are relatively short lived, these interactions can be neglected. Having gyromagnetic ratios 1000 times smaller than electrons, the Sn qubits should be relatively well isolated from most other sources of magnetic noise, which can also be mitigated using spin-echo pulses that can greatly extend nuclear-spin-qubit lifetimes.

Thus, the main errors of concern involving interactions between qubits occur during the two-qubit operations and should be independent if a sufficient distance between electrons is maintained. Furthermore, if the electrons are transient and do not have too many interactions with nuclear spins, correlations of these errors between different operations should not be a major concern. For this reason, we report error estimates based upon Born-rule probabilities, since there is little opportunity for coherent errors between different operations to add (constructively or destructively). If coherent errors do add in a systematic and controllable way, it should be possible to exploit this and adjust the schedule in order to cancel the coherent errors instead. We therefore feel justified in reporting error probabilities rather than amplitudes.

One important error category involves electron orbital and/or valley excitations. If such an excitation occurs, it can induce an uncertainty in the HFI with the nuclear-spin qubit and render the two-qubit operation unreliable. If the electron does not relax quickly, it can induce errors on every Sn that this electron touches. This is mitigated with sufficient orbital and valley energy gaps that are device specific. The orbital energy gap is determined by the electrostatic confinement of the quantum dot. The valley energy gap can be made large in a Si-MOS quantum dot with a strong vertical field to force the electron against the interface and can be made large in Si—Si—Ge devices with alloy engineering.

The maintenance of large orbital and valley energy gaps and the performance of smooth electron shuttling operations are clearly important for good qubit operation fidelities. In the following discussion, we consider the remaining errors, assuming that the electron follows the ground state faithfully. Specifically, we address the 15 two-qubit Pauli error channels for the following two spin-½ particles.

Electron and/or nuclear spin flip: Assuming that contact HFI dominates over any anisotropic interaction, the most likely error of this type would be a correlated flip-flop error via a diabatic transition from a sudden change of the contact HFI: $\hat{X} \otimes \hat{X}$, $\hat{X} \otimes \hat{Y}$, $\hat{Y} \otimes \hat{X}$, and $Y \otimes \hat{X}$. Including single flip errors that we anticipate to be less likely, this accounts for 12 of the 15 error channels $\hat{Z} \otimes \hat{Z}$ error: This is caused by an uncertainty in the time integration of the HFI with the Sn qubit. With relatively slow gate times, uncertainty of the peak hyperfine strength will likely dominate over timing jitter.

Electron Z error. This is caused by uncertainty in the effective magnetic field experienced by the electron due to sources other than the Sn qubit. This will likely be dominated by the Overhauser field induced by extraneous nuclear spins.

Nuclear Z rotation. This will likely be negligible if dynamical decoupling is employed to cancel slowly varying magnetic fields.

Given long T1 times of electron spins in silicon, the dominant spin-flip error mechanism during an e-n-CPhase operation is expected to be a correlated flip-flop ($\hat{X} \otimes \hat{X}$in-duced via a diabatic transition while switching the contact HFI on or off. The HFI is effectively turned on or off by moving the electron on or off the Sn qubit via electrostatic controls. Using QuTiP, we simulate various scenarios using a time-dependent Hamiltonian to switch the HFI on or off: $\hat{H}(t)=A(t)\hat{I} \times \hat{S}$. The limit of instantaneous switching is a worst-case scenario. However, this worst-case error probability is exceptionally low in the presence of a modest external B field, as shown in FIG. 4A. The error probability is below $10^{-6}$ for all of our HFI strengths beyond a modest 15 mT B field, well below known quantum-error-correction thresholds. In FIG. 4B, we do see that error probabilities can be reduced even further (enabling even smaller B fields at these very low error rates), by using slow and smooth transitions. In either case, this error mechanism is not a significant concern owing to the expected HFI of the Sn qubit being very weak relative to the electron and nuclear Zeeman-energy difference at modest (tens of millitesla) B fields.

One of the main advantages of using nuclear-spin qubits with interactions mediated by electron spins, besides minimal crosstalk concerns and precise NMR-ESR control, is that we can, in principle, take advantage of a "sweet spot" in the electron-nuclear interaction provided that we are able to move the electron to maximize the HFI and minimize its uncertainty. That is, by maximizing the HFI, we become insensitive to control uncertainty and charge noise to first order in a perturbative expansion.

Disregarding (i.e., projecting away) the other error channels and assuming that timing jitter is negligible (given the relatively long expected operation time, on the microsecond scale), the gate time can be tuned for the e-n-CPhase gate operation to become $\hat{U}=e^{i\phi(\hat{Z} \otimes \hat{Z})/2}=\cos(\phi/2)\hat{I} \otimes \hat{I}+i \sin(\phi/2) \hat{Z} \otimes \hat{Z}$ where $\phi=1+\Delta A/A)\pi$, with $\Delta A$ representing the uncertainty in the HFI. The Born-rule probability of a correlated $\hat{Z} \otimes \hat{Z}$ phase-flip error after an e-n-CPhase operation is therefore $\cos^2(\phi/2)=\sin^2((\phi-\pi)/2)\approx(\pi/2)^2(\Delta A/A)^2$. To lowest order, the average error probability is $$P_{Z \otimes Z}^{err} \approx \left(\frac{\pi}{2}\right)^2 \left\langle \left(\frac{\Delta A}{A}\right)^2 \right\rangle \qquad (6)$$

where the angle brackets denote averaging over noise realizations that impact $\Delta A$.

In the analysis that follows, we show that the $T_2/T^*_2$ ratio can actually serve as a proxy to determine expectations for $$P_{Z \otimes Z}^{err}, \text{ via } \left\langle (\Delta A / A)^2 \right\rangle$$

and Eq. (6), under a few simplifying assumptions. First, we assume that we have high-precision control of the quantum dot wave function in both lateral directions and that the charge noise of the system does not significantly influence the quantum dot in any manner that is fundamentally different from this lateral control.

The former requires more than a linear array of electrodes; at least one additional electrode would be required to move the electron in a direction that is orthogonal to a linear quantum dot array. The second assumption is potentially violated by the fact that a vertical field or local charge fluctuation can perturb the valley phase. We assume that such effects are negligible, however. This is not unreasonable. For Si—Si—Ge quantum dots, the fixed alloy composition largely dictates the valley phase. For Si-MOS quantum dots, the position of the oxide interface largely dictates the valley phase, given a sufficient vertical electric field The effect of vertical fields and local fluctuations deserves scrutiny in future work but we use the simplifying assumptions above for the analysis presented here. Furthermore, we take Eq. (5) as the form of the quantum dot wave function, parametrized by $x_0$, $y_0$, and $\theta_v$. By our second assumption above, $\theta_v$ only depends upon $x_0$ and $y_0$. We now consider a perturbation of the $x_0$ and $y_0$ parameters. Without loss of generality, we take $x_0=y_0=0$ (absorbing them into x and y). For convenience in notation, let $\xi_0=x_0$ and $\xi_1=y_0$. Since the HFI is proportional to the electron probability density at the nuclear site, $|\psi(n)|^2$, to second order we have $$\frac{\Delta A}{A} = \sum_i c_i \Delta \xi_i + \sum_{i,j} c_{i,j} \Delta \xi_i \Delta \xi_j + O((\Delta \xi)^3), \qquad (7)$$

$$c_0 = \left(\frac{2x}{r_0^2} + \tan\theta(z)\frac{\partial \theta_v}{\partial x_0}\right),$$

$$c_1 = \left(\frac{2y}{r_0^2} + \tan\theta(z)\frac{\partial \theta_v}{\partial y_0}\right),$$

$$c_{0,0} = \frac{2x^2}{r_0^4} - \frac{1}{r_0^2} + \frac{\tan\theta(z)}{2}\left(\frac{\partial^2 \theta_v}{\partial x_0^2} + \frac{4x}{r_0^2}\frac{\partial \theta_v}{\partial x_0}\right), + \frac{\tan^2\theta(z)-1}{4}\left(\frac{\partial \theta_v}{\partial x_0}\right)^2,$$

for $|z| < z_0/2$ (otherwise, A is zero in our model), where $\theta(z) = k_0 z - \theta_v/2$. The form of $c_{1,1}$ is similar to $c_{0,0}$ and $c_{0,1}$ and $c_{1,0}$ will not be important if we assume that $\Delta\xi_0$ and $\Delta\xi_1$ express independent random variables.

If the dot can be moved relative to a target qubit at $(x, y, z)$ such that the first-order term of $\Delta A/A$ vanishes (i.e., the sweet spot), then $$2x = -r_0^2 \tan\theta(z) \partial\theta_v / \partial x_0$$

and $$2y = -r_0^2 \tan\theta(z) \partial\theta_v / \partial y_0,$$

so that $$c_0 = c_1 = 0, \tag{8}$$

$$c_{0,0} = -\frac{1}{r_0^2} + \left| \frac{\tan\theta(z)}{2} \frac{\partial^2 \theta_v}{\partial x_0^2} - \frac{\tan^2\theta(z)+1}{4} \left(\frac{\partial\theta_v}{\partial x_0}\right)^2 \right|.$$

Furthermore, we can be selective with our choice of nuclear qubits at the expense of reducing their density (i.e., increasing the average distance between qubits in the chip). In our analysis, we choose to select only qubits for which $\tan 2\theta(z) \leq 1$; assuming that $\theta v$ is distributed evenly in this respect, this selectivity only reduces the candidates by half.

We now show how $T_2$ experiments can inform $$P_{Z\otimes Z}^{err}.$$

More specifically, we relate $$\langle T_2^* / T_2 \rangle \text{ to } \langle \Delta A / A \rangle,$$

which determines $$P_{Z\otimes Z}^{err}$$

via Eq. (6). Although spin-echo experiments of quantum dots are typically limited by the flip-flop dynamics of the nuclear spin bath, they will also be sensitive to shifts of the wave function that alter HFIs, serving as a bounding probe of electron location reproducibility in the presence of charge noise. That is, long $T_2$ spin-echo lifetimes would not be possible without the ability to control the location of electrons enough to keep $\langle (\Delta A_n/A_n)^2 \rangle$ small for the background of nuclear spins labeled by n.

These experiments may be performed in a single- or double-electron setting. The use of two electrons is sensible, since we can use Pauli-spin blockade readout, which does not require the large magnetic field needed for single-spin readout. Furthermore, refocusing pulses for the spin echo with two electrons may be performed using exchange-based swaps rather than requiring ESR. In this setting, echo experiments amount to preparing a singlet state (the ground state when two electrons are loaded into a confined space), swapping electron spins during their lifetimes to balance the amount of time they each spend in particular locations, and then reading singlet versus triplet via Pauli-spin blockage to determine the remnant of singlet-triplet rotations that are not canceled through swapping (as well as spin-flip errors).

From $T_2$ experiments, we can bound the contributors to $\langle (\Delta A_n/A_n)^2 \rangle$ .) $T_2^*$ measurements, in the ergodic limit, are also useful for obtaining this error probability bound. While $T_2$ is sensitive to changes of the HFIs (in addition to nuclear flip-flops), $T_2^*$ is sensitive to the magnitudes of the HFIs. As we show, the $T_2^*/T_2$ ratio provides a robust proxy to the $\hat{Z}\otimes\hat{Z}$ error-probability bound.

Let the $\hat{\phi}$ quantum operator represent the net Overhauser rotation induced during the experiment (reversed with each refocusing pulse). In the limit of a large number of nuclear spins, the outcomes are Gaussian distributed by the central limit theorem. The echo is the difference in the averaged measurement outcomes. For an upper bound of the echo decay curve, we consider the limit in which the nuclear-spin polarizations are static and pulses and measurements are instantaneous and ideal. Thus, $$\text{Echo} \leq \langle \cos^2(\hat{\phi}/2) - \sin^2(\hat{\phi}/2) \rangle = 2\langle \cos^2(\hat{\phi}/2) \rangle - 1 = \tag{9}$$

$$\exp\left(-\langle \hat{\phi}^2 \rangle/2\right) \equiv e^{-\left(aT_2^{(X)}\right)^2},$$

$$\left(T_2^{(X)}\right)^2 \leq 2t^2/\langle \hat{\phi}^2 \rangle. \tag{10}$$

The X in $$T_2^{(x)}$$

is a placeholder to mark the type of experiment (the pulse sequence).

A Carr-Purcell-Meiboom-Gill (CPMG) pulse sequence with m refocusing pulses is a sequence that—apart from details about the initial and final $\pi/2$ rotations, which are unimportant here—may be expressed as $(\tau \rightarrow \pi\tau)^m$. Each $\tau$ denotes free evolution for time $\tau$, $\pi$ denotes a refocusing pulse, and exponentiation by m denotes repetition. A Hahn echo, for our purposes, is simply the m=1 case of CPMG. For simplicity, we assume an independent noise realization of $\Delta A$, via $\Delta x_0$ and $\Delta y_o$, for each free evolution time. In reality, the HFI may vary during the free evolution time but we can lump that into an effective uncertainty. Also, the noise realizations may be correlated as a function of time; for this reason, our analysis only really informs $$P_{Z\otimes Z}^{err}$$

over the $T_2$ time scale since the last time that the e-n-CPhase gate was tuned up. With m≥1, and assuming a decay dominated by spin ½ nuclei (e.g., [29]Si) in addition to independent noise realizations of $\Delta A$, $$\langle (\hat{\phi}(\tau, m))^2 \rangle = [2 + 4(m-1)] \sum_n \langle (\Delta A_n \hat{I}_n^z \tau/\hbar)^2 \rangle = \frac{2m-1}{2} \sum_n \langle (\Delta A_n \tau/\hbar)^2 \rangle, \tag{11}$$

since there are two segments with a free evolution of $\tau$ and $m-1$ segments with a free evolution of $2\tau$. The net free evolution time is $t=2\,m\tau$. For the special case of $$T_2^*,$$

consider the Overhauser rotation with no refocusing pulses, so that $$\left\langle (\hat{\phi}(t, m=0))^2 \right\rangle = \sum_n \left\langle (A_n \hat{I}_n^z t/\hbar)^2 \right\rangle = \frac{\sum_n A_n^2 t^2}{4\hbar^2}. \tag{12}$$

Using Eq. (10) for $T(m)2$ with $m>1$ to denote CPMG with $m$ refocusing pulses and using $$T_2^* = T_2^{m=0},$$

we have $$\left( T_2^{(m)} \right)^2 \le \frac{16 m^2 \hbar^2}{(2m-1)\sum_n \left\langle (\Delta A_n)^2 \right\rangle}, \tag{13}$$

$$\left( T_2^* \right)^2 = \frac{8\hbar^2}{\sum_n A_n^2}, \tag{14}$$

$$\left\langle \left( \frac{T_2^*}{T_2^{(m)}} \right) \right\rangle \ge \frac{2m-1}{2m^2} \left\langle \frac{\sum_n \left\langle (\Delta A_n)^2 \right\rangle}{\sum_n A_n^2} \right\rangle. \tag{15}$$

Ideally, the averaging in Eq. (15) should be over a variety of dot locations and/or devices. In this way, the right-hand side of Eq. (15) will depend upon $\left\langle (\Delta\xi i)^2 \right\rangle$ and $\left\langle (\partial\theta v/\partial\xi i)^2 \right\rangle$ for $i \in \{0, 1\}$, assuming independent distributions and averaging over pertinent $\theta_v$-function realizations. At the sweet spot, the $\hat{Z} \otimes \hat{Z}$ error probability, to lowest order, depends upon $$\left\langle (\Delta\xi i)^4 \right\rangle, (\partial\theta v/\partial\xi i)^4, (\partial\theta v/\partial\xi i)^2 \partial^2\theta_v/\partial\xi_i^2,$$

and $$\left( \partial^2\theta_v/\partial\xi_i^2 \right)^2;$$

here, averaging is with respect to $\Delta\xi_i$ noise realizations but the $\theta_v$ function is fixed for a particular qubit. We can relate $\left\langle (\xi_i)^4 \right\rangle$ to $\left\langle (\Delta\xi_i)^2 \right\rangle$ if we assume that $\Delta\xi_i$ are Gaussian distributed; then, $$\left\langle (\Delta\xi_i)^4 \right\rangle = \left\langle (\Delta\xi_i)^2 \right\rangle^2 \times (4-1)!! = 3\left( (\Delta\xi_i)^2 \right)^2. \tag{16}$$

Furthermore, we note that $$\left| \partial^2\theta_v/\partial\xi_i^2 \right| \le \left\langle (\partial\theta_v/\partial\xi_i)^2 \right\rangle$$

should generally be true of smooth functions and uniform averaging. Finally, we may exploit our qubit selectivity freedom once more to choose qubits in which $(\partial^2\theta_v/\partial\xi_i)^2 \le \left\langle \partial\theta_v/\partial\xi_i|^2 \right\rangle$ at its sweet spot; assuming that $\partial\theta_v/\partial\xi_i$ is Gaussian distributed, about 68% of candidates will satisfy this requirement. Thus, with our assumptions, $$(\partial\theta_v/\partial\xi_i)^4, (\partial\theta_v/\partial\xi_i)^2 \partial^2\theta_v/\partial\xi_i^2,$$

and $$\left( \partial^2\theta_v/\partial\xi_i^2 \right)^2$$

are each bounded by a maximum of $\left\langle (\partial\theta_v/\partial\xi_i)^2 \right\rangle^2$.

We examine the worst-case performance at the sweet spot ($c_0=c_1=0$) by taking the limit of $$\left| \partial^2\theta_v/\partial\xi_i^2 \right| = \left| \partial\theta_v/\partial\xi_i \right|^2 \to \infty$$

for $i \in \{0, 1\}$ and using the worst-case value of $\tan\theta(z)=1$ (given our $\tan\theta(z)<1$ qubit selectivity). In this extreme limit and with our assumptions, from Eqs. (6)-(8) and (16), we derive $$P_{Z\otimes Z}^{err} \le 3\left( \frac{\pi}{2} \right)^2 \sum_{i=0}^{1} \left( \left\langle \left( \frac{\partial\theta_v}{\partial\xi_i} \right)^2 \right\rangle (\Delta\xi_i)^2) \right)^2, \tag{17}$$

and from Eq. (15), $$\left\langle \left( \frac{T_2^*}{T_2^{(m)}} \right) \right\rangle \ge a \frac{2m-1}{2m^2} \sum_{i=0}^{1} \left( \left\langle \left( \frac{\partial\theta_v}{\partial\xi_i} \right)^2 \right\rangle (\Delta\xi_i)^2) \right), \tag{18}$$

$$a = \left\langle \frac{\sum_n \tan^2\theta_n A_n^2}{\sum_n A_n^2} \right\rangle.$$

We compute a numerically for all combinations of silicon quantum dots with $r_0 \in \{10, 20\}$ nm and $z_0 \in \{5, 10\}$ nm for both 500-parts-per-million (ppm) and 1000-ppm $^{29}$Si and obtain $a=0.34\pm0.01$ (bounding the estimate over the standard of error range in each case).

We plot the pessimistic bounds of $\hat{Z} \otimes \hat{Z}$ versus $$\left\langle (T_2^*/T_2^{Hahn})^2 \right\rangle$$

at the sweet spot for the extreme case of $$\partial^2\theta_v/\partial\xi_i^2 = \left| \partial\theta_v/\partial\xi_i \right|^2 \to \infty$$

and $\tan\theta(z)=1$ and the optimistic limit of

US 12,701,752 B2

15

$$\partial^2 \theta_v / \partial \xi_i^2 = (\partial \theta_v / \partial \xi_i)^2 = 0,$$

as well as Cases away from the sweet spot, in FIG. 5. By using a ratio of $T_2$ versus $$T_2^*,$$

the results are robust to isotopic enrichment and quantum dot size. As a point of reference, $$(T_2^*/T_2^{Hahn})^2 \approx 10^{-5}$$

has been measured in Si—Ge devices but not one with electrostatic gates providing the bidirectional control that we require for the sweet-spot performance. If we assume an accuracy of control that matches the reliability demonstrated by $$T_2^{Hahn}$$

measurements, we can justify the lateral sweet-spot limit. These results may easily be translated for longer CPMG pulse sequences according to the m dependence in Eq. (15). The use of many-pulse CPMG may be valuable for making the bound tighter (via removing effects of nuclear flip-flops) and/or for probing longer time scales of the charge noise and temporal correlations of Δ.

During the relatively long duration of the e-n-CPhase operation, nuclei other than the Sn qubit may induce an unwanted rotation on the electron spin. This extraneous nuclear spin bath imparts an effective magnetic field on the electron, which is known as the Overhauser field. In natural Si, nearly 5% of the silicon atoms will have a nuclear spin. These $^{29}$Si nuclear spins may be removed via enrichment, which has been demonstrated in many Si-qubit experiments. However, the cost of enrichment increases with the purity level and must be weighed against the benefits. Furthermore, there may be other nuclear species present with nonzero spin depending upon the chemistry of the silicon well and the fabrication process.

In a modest magnetic field, nuclear spin baths are known to evolve slowly, largely through dipolar interactions among like nuclear species. Due to this fact, there are ways to mitigate this error. It is possible to monitor the Overhauser field and compensate for its effect (via ESR, spin-orbit effects, or a micromagnet) as it slowly drifts. Furthermore, in principle, we can use a spin-echo technique to filter out the low-frequency part of the Overhauser-field noise by flipping the extraneous spins relative to the qubit via NMR. This could be effected by flipping just the bath spins or by flipping both the Sn and electron spins (but not the bath spins) and it may be performed while the qubits are inter-acting or in between two halves of the e-n-CPhase operation.

The electron Z-flip error induced by an Overhauser field is a simple function of $$T_2^*$$

16

(or effectively $$T_2^*$$

if a mitigation strategy is employed):

$$P_c-Z-\text{flip} = \langle \sin^2(\hat{\phi}/2) \rangle = \frac{1}{2}\left(1 - \exp\left(-\langle \hat{\phi}^2 \rangle/2\right)\right) = \tag{19}$$

$$\frac{1}{2}\left(1 - \exp\left(-(T/T_2^*)^2\right),\right)$$

where T is the gate time. This follows from Eq.

$$\text{via } \langle \hat{\phi}^2 \rangle = 2(t/T_2^*)^2 \tag{10}$$

and the assumption (as before) that the outcomes of $\hat{\phi}$ are Gaussian distributed.

TABLE 1

| | Ah | | |
|---|---|---|---|
| | 100 kHz | 200 kHz | 400 kHz |
| | | T | |
| $T_2^*$ | 5 μs | 2.5 μs | 1.25 μs |
| 1 μs | 0.5 | 0.5 | 0.4 |
| 10 μs | 0.1 | 0.03 | $7.8 \times 10^{-3}$ |
| 100 μs | $1.3 \times 10^{-3}$ | $3.1 \times 10^{-4}$ | $7.8 \times 10^{-5}$ |

To convey a sense of the potential magnitude of this error, FIG. 6 shows theoretical cumulative probability distributions of $$T_2^*$$

for various quantum dot shapes and levels of $^{29}$Si enrichment (with no other nuclear isotope considered) and Table 1 presents error probabilities corresponding to a few $$T_2^*$$

values and gate times computed directly from Eq. (19). Without significant enrichment and/or a particularly strong hyperfine interaction with the qubit, this error may be substantial and concerning; however, it should be possible to reduce the effective $$T_2^*$$

considerably by employing either of the two mitigation strategies we have suggested above (spin-bath refocusing or drift compensation via tracking the Overhauser rotation).

FIGS. 7A and 7B depict a qubit coupling system in accordance with an illustrative embodiment. FIG. 7A depicts the qubit system in an off position. FIG. 7B depicts the qubit system in an on position.

Qubit coupling system 700 comprises a silicon (Si) substrate 702 and a number of quantum dot electrodes 706 over the silicon substrate. A silicon dioxide ($SiO_2$) layer 704 is positioned between the silicon substrate 702 and the quantum dot electrodes 706. The silicon substrate 702 might be isotopically enriched with silicon-28 ($^{28}Si$) isotopes to minimize silicon-29 ($^{29}Si$) isotopes.

A tin (Sn) atom 710 is embedded in the silicon substrate 702. The tin atom 710 might comprise a tin-119 ($^{119}Sn$) or tin-117 ($^{117}Sn$) isotope. For ease of illustration, the present example only shows a single tin atom.

An electron source 708 is connected to the silicon substrate 702.

The quantum dot electrodes 706 are configured to adiabatically move an electron 712 from the electron source toward the tin atom 710 to achieve a specified level hyperfine interaction (HFI) between the electron and the nucleus of the tin atom to minimize noise.

The quantum dot electrodes 706 hold the electron 712 at the distance of specified HFI for a specified duration of time to represent an "on" state (shown in FIG. 7B). The quantum dot electrodes 706 adiabatically move the electron 712 away from the tin atom 710 to lower the HFI below the specified level, which represents an "off" state (shown in FIG. 7A). The spin of the electron 712 comprises a first qubit, and nuclear spin of the tin atom 710 comprises a second qubit.

FIG. 8 depicts a flowchart illustrating a process for coupling qubits in accordance with an illustrative embodiment. Process 800 can be implemented with qubit coupling system 700 in FIGS. 7A and 7B.

Process 800 begins by embedding a tin atom in a silicon substrate (step 802) and forming a number of quantum dot electrodes over the silicon substrate (step 804).

The quantum dot electrodes, draw an electron from an electron source into the silicon substrate (step 806). To perform an electron-nuclear controlled-phase gate operation the quantum dot electrodes move the electron adiabatically toward the tin atom to achieve a specified level of hyperfine interaction (HFI) between the electron and the nucleus of the tin atom to minimize the effect of noise (e.g., charge or voltage noise) (step 808). The specified level of HFI might be maximize HFI.

The quantum dot electrodes hold the electron at the distance of the specified HFI for a specified duration of time to represent an "on" state (step 810). The electron might be held at least until there is a controlled-π rotation in phase.

The quantum dot electrodes move the electron adiabatically away from the tin atom to lower the HFI below the specified level and represent an "off" state (step 812). The external magnetic field and on-off switching time may be tuned to reduce flip-flop probabilities during the electron-nuclear controlled-phase gate operation as shown in FIGS. 4A and 4B. A modest magnetic field of 10 s of mT is sufficient to strongly suppress flip-flop errors regardless of on-off switching time.

Process 800 then ends.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for coupling qubits, the method comprising:
embedding a tin atom in a silicon substrate;
forming a number of quantum dot electrodes over the silicon substrate;
drawing, with the quantum dot electrodes, an electron from an electron source into the silicon substrate;
performing an electron-nuclear controlled-phase gate operation by:
moving, with the quantum dot electrodes, the electron adiabatically toward the tin atom to achieve a specified level of hyperfine interaction (HFI) between the electron and the nucleus of the tin atom to minimize the effect of noise;
holding, with the quantum dot electrodes, the electron at the distance of the specified HFI for a specified duration of time to represent an "on" state; and
moving, with the quantum dot electrodes, the electron adiabatically away from the tin atom to lower the HFI below the specified level and represent an "off" state.

2. The method of claim 1, wherein the specified level of HFI is maximize HFI.

3. The method of claim 1, further comprising isotopically enriching the silicon substrate with silicon-28 isotopes to minimize silicon-29 isotopes.

4. The method of claim 1, wherein the tin atom comprises a tin-119 or tin-117 isotope.

5. The method of claim 1, wherein spin of the electron comprises a first qubit and nuclear spin of the tin atom comprises a second qubit.

6. The method of claim 1, wherein the electron is held at least until there is a controlled-π rotation in phase.

7. The method of claim 1, further comprising tuning the electron-nuclear controlled-phase gate operation with an external magnetic field with a strength on the order of 10 s of mT to suppress flip-flop errors.

8. A method for coupling qubits, the method comprising:

drawing, by a number of quantum dot electrodes, an electron from an electron source into a silicon substrate that contains an embedded tin atom;

moving, with the quantum dot electrodes, the electron adiabatically toward the tin atom to achieve a specified level of hyperfine interaction (HFI) between the electron and the nucleus of the tin atom to minimize the effect of noise;

holding, with the quantum dot electrodes, the electron at the distance of the specified HFI for a specified duration of time to represent an "on" state; and moving, with the quantum dot electrodes, the electron adiabatically away from the tin atom to lower the HFI below the specified level and represent an "off" state.

9. The method of claim 8, wherein the specified level of HFI is maximize HFI.

10. The method of claim 8, further comprising isotopically enriching the silicon substrate with silicon-28 isotopes to minimize silicon-29 isotopes.

11. The method of claim 8, wherein the tin atom comprises a tin-119 or tin-117 isotope.

12. The method of claim 8, wherein spin of the electron comprises a first qubit and nuclear spin of the tin atom comprises a second qubit.

13. The method of claim 8, wherein the electron is held at least until there is a controlled-π rotation in phase.

14. The method of claim 8, further comprising tuning the electron-nuclear controlled-phase gate operation with an external magnetic field with a strength on the order of 10 s of mT to suppress flip-flop errors.

15. A qubit coupling system, comprising:

a silicon substrate;

a tin atom embedded in the silicon substrate;

a number of quantum dot electrodes over the silicon substrate;

an electron source connected to the silicon substrate, wherein the quantum dot electrodes are configured to perform an electron-nuclear controlled-phase gate operation by adiabatically moving an electron from the electron source toward the tin atom to achieve a specified level hyperfine interaction (HFI) between the electron and the nucleus of the tin atom to minimize the effect of noise, holding the electron at the distance of specified HFI for a specified duration of time, which represents an "on" state, and adiabatically moving the electron away from the tin atom to lower the HFI below the specified level, which represents an "off" state.

16. The system of claim 15, further comprising a silicon dioxide layer between the silicon substrate and the quantum dot electrodes.

17. The system of claim 15, wherein the silicon substrate is isotopically enriched with silicon-28 isotopes to minimize silicon-29 isotopes.

18. The system of claim 15, wherein the tin atom comprises a tin-119 or tin-117 isotope.

19. The system of claim 15, wherein spin of the electron comprises a first qubit and nuclear spin of the tin atom comprises a second qubit.

20. The system of claim 15, wherein flip-flop errors are suppressed by tuning the electron-nuclear controlled-phase gate operation with an external magnetic field with a strength on the order of 10 s of mT.

\* \* \* \* \*